(12) United States Patent
Bouton et al.

(10) Patent No.: US 10,115,666 B2
(45) Date of Patent: Oct. 30, 2018

(54) METHOD FOR MAKING A PHOTOLITHOGRAPHY MASK INTENDED FOR THE FORMATION OF CONTACTS, MASK AND INTEGRATED CIRCUIT CORRESPONDING THERETO

(71) Applicant: STMICROELECTRONICS (ROUSSET) SAS, Rousset (FR)

(72) Inventors: Guilhem Bouton, Peynier (FR); Patrick Regnier, Rians (FR)

(73) Assignee: STMICROELECTRONICS (ROUSSET) SAS, Rousset (FR)

( * ) Notice: Subject to any disclaimer, the term of this patent is extended or adjusted under 35 U.S.C. 154(b) by 672 days.

(21) Appl. No.: 14/221,401

(22) Filed: Mar. 21, 2014

(65) Prior Publication Data
US 2014/0291858 A1 Oct. 2, 2014

(30) Foreign Application Priority Data

Mar. 29, 2013 (FR) ...................................... 13 52894

(51) Int. Cl.
| | |
|---|---|
| *H01L 21/4763* | (2006.01) |
| *H01L 23/528* | (2006.01) |
| *H01L 21/033* | (2006.01) |
| *H01L 21/768* | (2006.01) |
| *H01L 23/522* | (2006.01) |
| *H01L 21/311* | (2006.01) |

(Continued)

(52) U.S. Cl.
CPC .............. *H01L 23/528* (2013.01); *G03F 1/38* (2013.01); *G03F 1/50* (2013.01); *H01L 21/0337* (2013.01); *H01L 21/31144* (2013.01); *H01L 21/76802* (2013.01); *H01L 21/76816* (2013.01); *H01L 23/5226* (2013.01); *H01L 24/09* (2013.01); *H01L 23/522* (2013.01); *H01L 2224/0603* (2013.01); *H01L 2224/0812* (2013.01); *H01L 2924/0002* (2013.01)

(58) Field of Classification Search
CPC ........... H01L 21/0337; H01L 21/76802; H01L 23/5226; H01L 23/48; H01L 28/90
USPC .............. 257/774, 777; 438/667, 386; 430/5
See application file for complete search history.

(56) References Cited

U.S. PATENT DOCUMENTS

| | | | |
|---|---|---|---|
| 5,753,417 A | 5/1998 | Ulrich | |
| 6,001,733 A | 12/1999 | Huang et al. | |

(Continued)

FOREIGN PATENT DOCUMENTS

| | | |
|---|---|---|
| JP | 60153148 | 8/1985 |
| JP | 07-201994 | 4/1995 |

(Continued)

*Primary Examiner* — A. Sefer
(74) *Attorney, Agent, or Firm* — Seed Intellectual Property Law Group LLP

(57) ABSTRACT

A method for making a photolithography mask for formation of electrically conducting contact pads between tracks of a metallization level and electrically active zones of integrated circuits formed on a semiconductor wafer includes forming a first mask region including first opening zones intended for the formation of the contact pads. The first opening zone has a first degree of opening that is below a threshold. A second mask region including additional opening zones is formed, with the overall degree of opening of the mask being greater than or equal to the threshold.

20 Claims, 5 Drawing Sheets

(51) Int. Cl.
   *G03F 1/50*   (2012.01)
   *H01L 23/00*  (2006.01)
   *G03F 1/38*   (2012.01)

(56) References Cited

U.S. PATENT DOCUMENTS

| | | |
|---|---|---|
| 6,306,755 B1 | 10/2001 | Zheng |
| 6,391,736 B1 | 5/2002 | Uh et al. |
| 6,433,878 B1* | 8/2002 | Niu .................... G03F 7/70441 |
| | | 356/392 |
| 6,703,170 B1* | 3/2004 | Pindo ....................... G03F 1/36 |
| | | 430/30 |
| 2001/0049188 A1 | 12/2001 | Umemoto |
| 2003/0232483 A1 | 12/2003 | Fujiishi |
| 2006/0065981 A1* | 3/2006 | Egusa ................... H01L 23/522 |
| | | 257/774 |
| 2007/0007658 A1 | 1/2007 | Tomita et al. |
| 2007/0178691 A1 | 8/2007 | Richter et al. |
| 2008/0072203 A1* | 3/2008 | Bergman Reuter ........................ |
| | | G06F 17/5072 |
| | | 716/122 |
| 2009/0087956 A1 | 4/2009 | Rao et al. |
| 2009/0115068 A1 | 5/2009 | Jang |
| 2009/0221126 A1* | 9/2009 | Jung ....................... H01L 28/90 |
| | | 438/386 |
| 2010/0078810 A1 | 4/2010 | Matsui et al. |
| 2010/0243605 A1 | 9/2010 | Nishizuka |
| 2014/0057393 A1 | 2/2014 | Bonart |
| 2014/0106264 A1* | 4/2014 | Campidell .......... G03F 7/70733 |
| | | 430/5 |

FOREIGN PATENT DOCUMENTS

| | | |
|---|---|---|
| JP | 2002319619 | 10/2002 |
| KR | 100895375 | 4/2006 |

\* cited by examiner

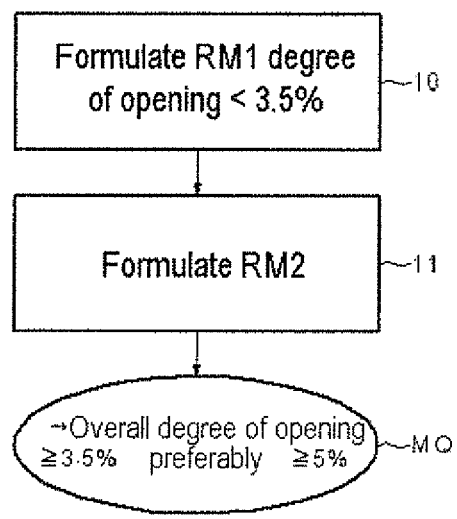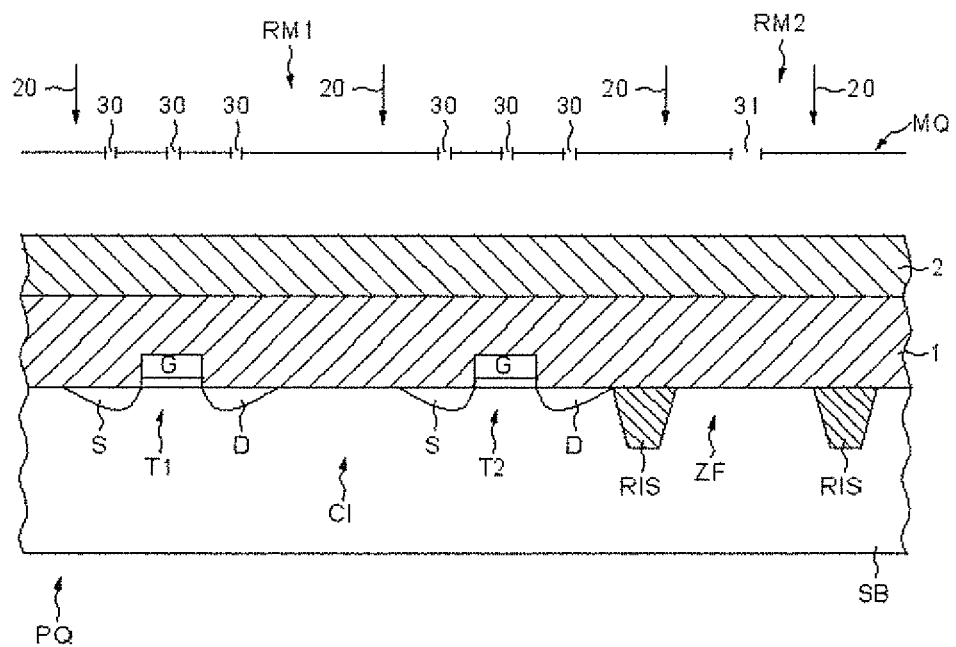

METHOD FOR MAKING A PHOTOLITHOGRAPHY MASK INTENDED FOR THE FORMATION OF CONTACTS, MASK AND INTEGRATED CIRCUIT CORRESPONDING THERETO

FIELD OF THE INVENTION

The invention relates to integrated circuits, and more particularly, to the making of a photolithography mask intended for the formation of electrically conducting contact pads between tracks of a metallization level and electrically active zones of integrated circuits produced on a semiconductor wafer.

BACKGROUND

Integrated circuits are generally produced on a semiconductor wafer, which is generally disc shaped, in regions of the wafer that are separated by slicing lines. After production of the components of the various integrated circuits in the substrate of the wafer, and production of the interconnection parts (commonly referred to as BEOL: Back End Of Line) of the integrated circuits, the wafer is cut into individual chips by slicing it along the slicing lines.

Deposition of the various layers as well as the diverse etching operations are performed on the whole wafer. Among the operations performed include the formation of the electrically conducting contact pads, referred to more simply as contacts. The contacts link tracks of the first metallization level of the interconnection parts of the integrated circuits to electrically active regions of the circuits, for example, source, drain, gate regions, or polysilicon lines forming resistors, for example.

The formation of these contacts comprises etching an electrically insulating layer disposed above the substrate of the integrated circuits so as to form orifices or vias which will thereafter be filled with an electrically conducting material. The electrically conducting material may be metal, for example, such as tungsten.

In certain cases it turns out that integrated circuits, or in the worst case, certain wafers exhibit, especially in their central region, contacts that are not fully etched. This means that the contacts are non-emergent. Therefore, these contacts do not allow for an electrical link to be established between the corresponding metallic track and the underlying active region. These circuits or wafers may then become unusable, which is undesirable, especially in terms of production costs.

SUMMARY

According to one mode of implementation and embodiment, it is proposed to reduce the risk of obtaining contact pads that are interrupted in a central region of a wafer.

It may be possible to reduce the presence of non-open contacts, in particular, in the central region of the wafer, by acting not on the etching operation itself, but on the degree of the opening of the photolithography mask. The photolithography mask may be used to define the sites of these contacts, that is, the etched orifices or vies which may be filled with metal to form these contacts.

More particularly, the presence of non-open contacts may occur when the degree of opening of the mask is below a threshold value. If the degree of opening of the region of the mask intended to form these contacts is below the threshold value, then it may be appropriate to increase the overall degree of opening of the mask, for example, through the addition of dummy contacts, so as to obtain an overall degree of opening greater than or equal to the threshold value.

According to one aspect, a method for making a photolithography mask intended for the formation of electrically conducting contact pads between the tracks of a metallization level and electrically active zones of integrated circuits produced is provided.

The method may comprise making a first mask region comprising first opening zones intended for the formation of the contact pads. The first mask region may include a first degree of opening that is below a threshold value. A second mask region may comprise additional opening zones, with the overall degree of opening of the mask being greater than or equal to this threshold value.

As indicated above, the problem of the occurrence of non-open contacts, in particular at the center of the wafer, occurred when the degree of opening of the first region of the mask, that is, the region intended to actually define the metallic contacts, was below a threshold. Consequently, this mask may be supplemented with additional opening zones so as to increase the overall degree of opening of the mask beyond the threshold.

The threshold value may depend on the characteristics of the etching method used. Thus, if for a given etching method, the occurrence of non-emergent contacts is apparent, in particular, in the central region of the wafer, the degree of opening of the mask may be increased so as to address this issue. An adjustment to the threshold value may be made as a function of the intended application. In a current state of the etching methods customarily used to form the contacts, it may be advantageously possible to set a numerical value for this threshold to address this issue, regardless of etching method being used.

Thus, above 3.5%, a decrease in the risk of occurrence of non-open contacts may be achieved. The more significant the overall degree of the opening, the more the risk decreases. Thus, above 5%, the risk may be considerably reduced or in certain cases, eliminated.

The threshold may be independent of the technology used. Furthermore, the placement of the additional opening zones may turn out to be of no significance as long as they do not interfere with the electrically active regions of the integrated circuits.

Integrated circuits may generally comprise dummy zones or areas, for example, dummy active zones and dummy polysilicon zones that are generated to fill in the internal free spaces of the integrated circuit. This may be, in particular, during the chemical-mechanical polishing steps so as to avoid digging into the integrated circuit at the level of its void spaces.

It may be particularly advantageous that the additional opening zones are positioned so as to correspond to sites located on dummy zones of at least some of the integrated circuits, and to sites located away from the metallic tracks of the metallization level.

Thus, the additional contacts which will be generated may be totally electrically inactive since they are in contact with dummy zones, and not in contact with tracks of the metallic level.

Each additional opening zone may have a greater surface area than that of a first opening zone. This may make it possible to effectively increase the overall degree of opening of the mask without escalating the number of additional openings too significantly.

Thus, by way of a non-limiting example, each first opening zone may be a square of side r and each additional opening zone may be a square of side r equal to at least 2r. It may be preferable that each additional opening zone has a smaller surface area than a limited surface area. Indeed, the more significant the opening of a contact, the more the risk that the filling of the contact with the electrically conducting material, tungsten for example, may be imperfect. This may then lead to the creation of a parasitic topology for the remainder of the method for producing the interconnection part (BEOL) of the integrated circuits. When the first opening zone is a square of side r, it is preferable that the limited surface area for each additional opening zone may be equal to $25r^2$.

According to another aspect, a method for producing electrically conducting contact pads between tracks of a metallization level and electrically active zones of the integrated circuit produced in and on a semiconductor wafer may include a formation below the integrated circuits of an electrically insulating layer, a formation of a photosensitive resin layer above the electrically insulating layer, an irradiation of the resin through the photolithography mask obtained by the method such as defined hereinabove, a development of the irradiated resin, an etching of at least one part of the insulating layer through the developed resin and a filling of the etched vias with an electrically conducting material.

Since the etching rate may decrease as the opening of the zone to be etched increases, it may be possible, according to one mode of implementation, that during the etching of the insulating layer, at least one of the vias corresponding to at least one of the additional opening zones of the mask may not be fully etched there through.

According to another aspect, a photolithography mask, intended for the formation of electrically conducting contact pads between a metallization level and electrically active zones of integrated circuits produced on a semiconductor wafer, may comprise a first mask region comprising first opening zones for the formation of the contact pads having a first degree of opening that is below a threshold value (e.g., 3.5%), and a second mask region comprising additional opening zones. The overall degree of opening of the mask may be greater than or equal to the threshold value, and preferably, greater than or equal to 5%.

According to one mode of implementation, each additional opening zone may have a greater surface area than that of a first opening zone. Thus, by way of example, when each first opening zone is a square of side r, each additional opening zone may be a square of a side equal to at least 2r. Each additional opening zone may preferably have a smaller surface area than a limited surface area equal, for example, to $25r^2$.

According to another aspect, an integrated circuit may comprise electrically conducting contact pads between tracks of a metallization level and electrically active zones, and at least one additional pad extending from at least one dummy active zone of the integrated circuit to a location not in contact with a track of the metallization level.

The at least one additional pad may have a larger transverse section than that of the contact pads. The at least one additional pad may have a transverse dimension between 2 and 5 times a homologous or common transverse dimension of the contact pads.

The at least one additional pad may comprise an electrically conducting material not in contact with the corresponding dummy zone. The at least one additional pad may comprise an electrically conducting material not in contact with the corresponding dummy zone.

BRIEF DESCRIPTION OF THE DRAWINGS

Other advantages and characteristics of the invention will be apparent on examining the detailed description of wholly non-limiting modes of implementation and embodiments, and the appended drawings, in which:

FIG. 1 is a flowchart illustrating steps of producing a mask in accordance with the present invention.

FIGS. 2 to 5 are schematic cross-sectional views describing a mode of implementation and a method for producing the contact pads with the mask provided in FIG. 1.

DETAILED DESCRIPTION OF THE EMBODIMENTS

Figure 3:
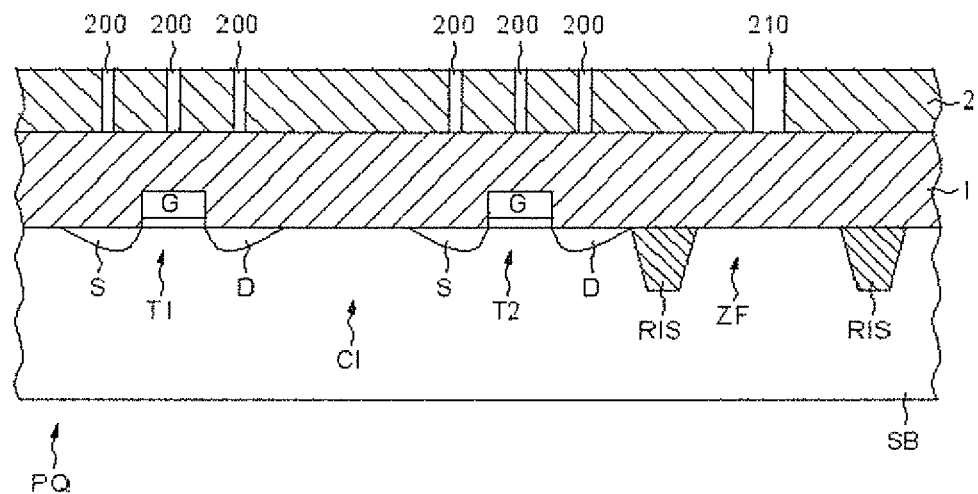

FIG. 1 schematically illustrates steps of producing a mask, termed a contact mask, intended for the formation of the electrically conducting contact pads between tracks of a metallization level, typically the first metallization level, and electrically active zones of integrated circuits produced on a semiconductor wafer.

Typically, the photolithography mask comprises a first region RM1 comprising first opening zones intended for the formation of the contact pads. These first opening zones are typically formed by an optically transparent material, such as quartz, for example, and are delimited by zones that are optically totally opaque or partially opaque. Totally opaque zones may be formed of chromium, for example, and partially opaque zones may be formed of molybdenum silicide ($MoSi_2$), for example.

The terminology opening zones is used since these zones actually define the vias made in the resin, and subsequently, in the insulating layer. The vias in the insulating layer may be filled with metal to form the contacts.

The degree of opening of the first mask region is defined as being the ratio between the surface area of the whole set of first opening zones and the useful total surface area of the mask. The useful surface area of the mask does not include use of the borders of the mask comprising identification numbers, pre-alignment patterns, etc., for example.

When the degree of opening of the first mask region RM1 is less than 3.5%, a second mask region RM2 comprising additional opening zones is then made (step 11) so that the overall degree of opening of the mask MQ made is greater than or equal to 3.5%, and preferably greater than or equal to 5%.

Likewise, the overall degree of opening of the mask is defined as being the ratio between the surface area of all the optically transparent zones and the total useful surface area of the mask.

Thus, according to one mode of implementation, an increase may be made to a value at least equal to 3.5%, and preferably at least equal to 5%, of the overall degree of opening of a photolithography mask. The photolithography mask includes a first mask region intended for the formation of electrically conducting contact pads and has a degree of opening of less than 3.5% to reduce the risk of obtaining contacts pads that are interrupted in a central region of the wafer.

Reference is now made more particularly to FIGS. 2 to 5 to schematically describe a mode of implementation and a method for producing the contact pads.

In FIG. 2, the reference PQ designates a semiconductor wafer comprising a substrate SB which can be a massive substrate or a substrate of the silicon-on-insulator type (SOI substrate).

Within the substrate SB are produced integrated circuits CI comprising components such as transistors T1 and T2, electrical insulation zones RIS, such as shallow trench isolation (STI) or dummy zones ZF intended to fill in free spaces, if any, within the integrated circuits so as to avoid digging into the wafer during chemical-mechanical polishing steps. These dummy zones ZF may be, for example, substrate zones or polysilicon regions disposed above the substrate.

During a subsequent step, the substrate SB as well as the components, and especially the gate regions G of the transistors, are covered with an electrically insulating layer 1. This electrically insulating layer is thereafter covered with a photosensitive resin layer 2 which will be irradiated with luminous radiation, such as ultraviolet radiation 20, for example, through the photolithography mask MQ.

As indicated above, the photolithography mask MQ comprises first opening zones 30 intended to define the sites of the contacts of the integrated circuits as well as additional opening zones 31 intended to increase the overall degree of opening of the mask MQ.

As represented in FIG. 2, the additional opening zones 31 preferably have a greater surface area than that of the first opening zones 30 and are positioned, for example, so as to correspond to sites located on the dummy zones ZF.

After irradiation of the resin and development of the latter, orifices or vias 200 and 210 are obtained, as illustrated in FIG. 3, passing through the resin and corresponding respectively to the first opening zones 30 and to the additional opening zones 31.

Figure 4:
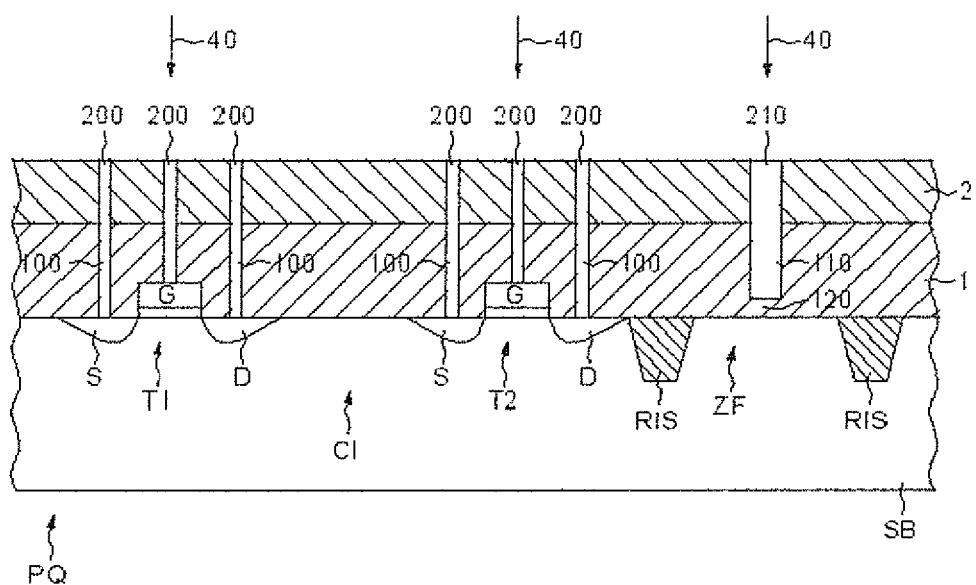

Next, as illustrated in FIG. 4, the method continues with a step 40 of etching the insulating layer 1 using the resin layer 2 as a hard mask so as to form, in this insulating layer 1, vias 100 running along the extension of the vias 200 and vias 110 running along the extension of the vias 210.

The vias 100 are prominent on the electrically active zones of the integrated circuits, for example, the source region S, drain region D and gate region G of the transistors, or polysilicon regions located above the substrate SB in the same appearance or manner as the gate regions, and forming resistive lines.

As a function of the surface of the additional opening zones 31 of the mask MQ, some of the vias 110 intended, as will be seen in greater detail after formation of dummy contacts, are not fully etched therethrough and remain hidden. Therefore, a residue 120 of insulating material remains between the via 110 and the dummy zone ZF.

Figure 5:
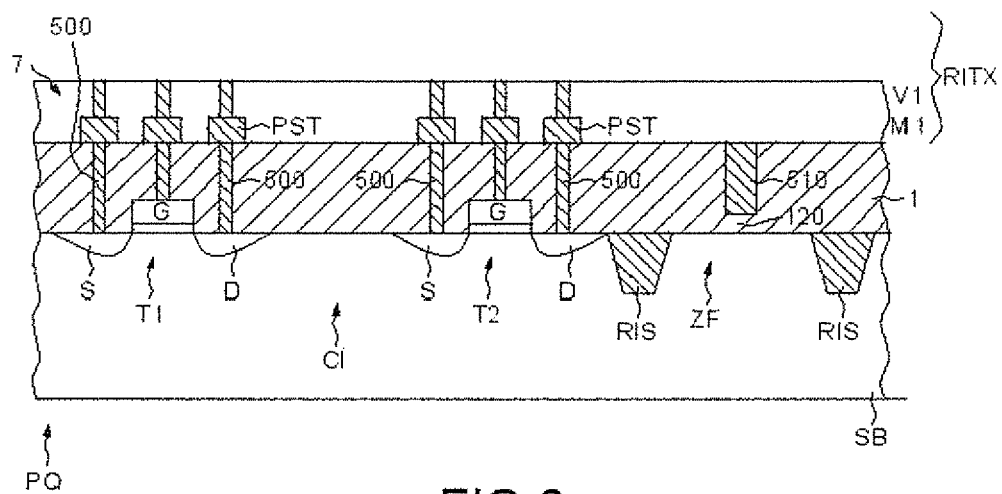

Next, as illustrated in FIG. 5, the resin layer 2 is removed and the etched vias 100 and 110 are filled with an electrically conducting material, for example metal, such as tungsten, so as to form the contact pads 500 which emerge on the electrically active zones of the integrated circuit CI, and dummy contacts 510.

Some of the dummy contacts may actually emerge in dummy zones ZF or as illustrated in FIG. 5, have their electrically conducting material not in contact with the corresponding dummy zone ZF and comprise an insulating material 120 between the electrically conducting material of the additional contact 510 and the corresponding dummy zone ZF.

The metallic tracks PST of the first metallization level M1 are thereafter formed in a conventional manner. It is noted in this regard that the contacts 500 emerge on a metallic track PST while the additional contact 510 extends to a location not in contact with a track PST of the metallization level.

The metallic tracks PST as well as the first level of vias of the interconnection part RITX of the integrated circuit are encapsulated in a dielectric material 7. The dielectric material 7 is commonly designated as an inter-metal dielectric (IMD) material. The other levels, if any, of the part BEOL are formed thereafter in a conventional manner. After production of all the integrated circuits, the wafer PQ is sliced according to the slicing lines so as to cut it into individual integrated circuits.

Figure 6:
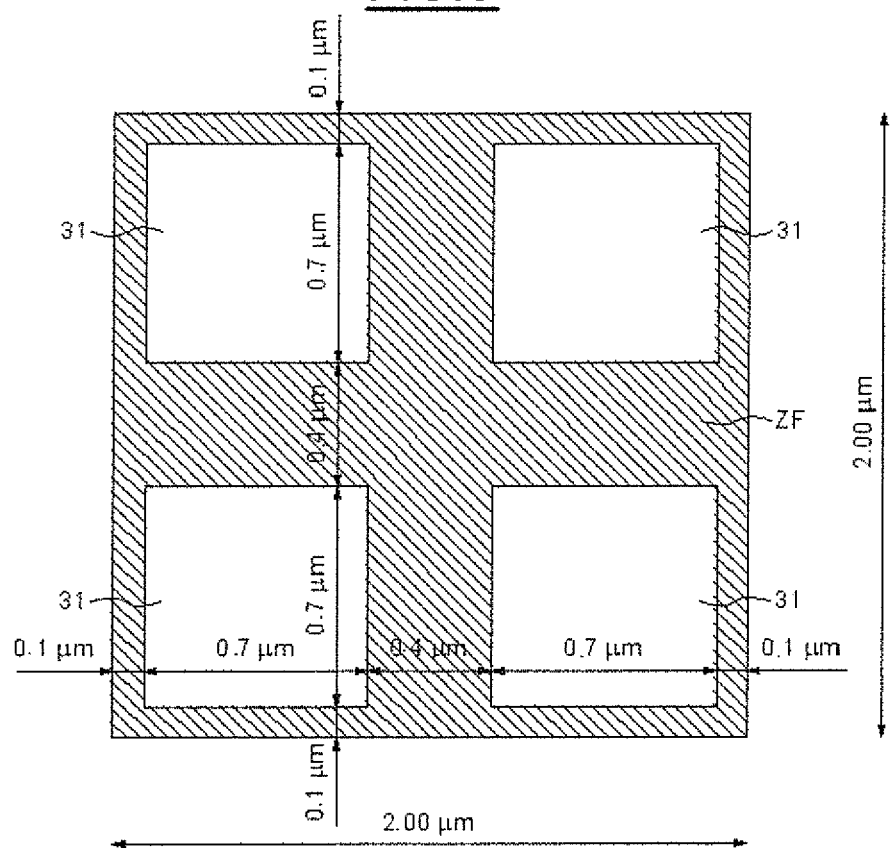
FIG. 6 is a top plan view of additional opening zones of the mask above a dummy zone so as to form additional contact pads in accordance with the present invention.

Reference is now made to FIGS. 6 to 9, to illustrate particular examples of additional opening zones of the mask MQ. More precisely, FIG. 6 illustrates an example of additional opening zone 31 of the mask MQ in a 130-nm technology. In such a technology, the mask opening zones intended to form the actual contacts of the integrated circuit are squares sized 0.2 microns by 0.2 microns.

The additional opening zones 31 may be, for example, squares of 0.7 microns sides, thereby making it possible to position four of these additional opening zones 31 above a dummy zone ZF formed of a square of 2 microns sides so as subsequently to form up to four additional contact pads (dummy contacts).

Figure 7:
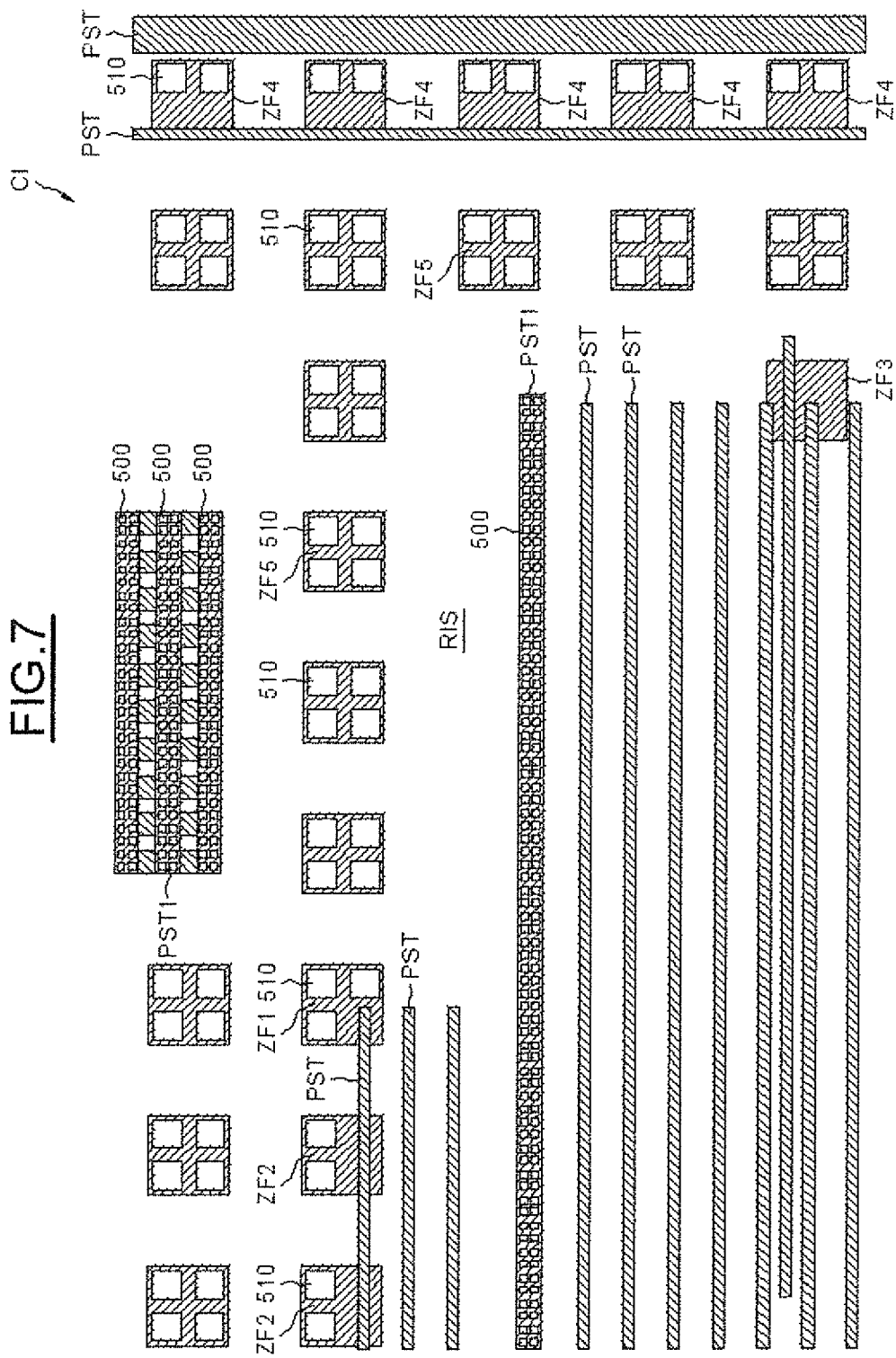
FIG. 7 is a top plan view of a portion of an integrated circuit with insulating regions, metallic tracks, and dummy zones with additional contacts in accordance with the present invention.

In FIG. 7 is represented a portion of integrated circuit CI. In this representation, the unshaded zones are the insulating regions RIS. The integrated circuit also comprises certain metallic tracks PST1 of the metal level M1, in contact with underlying electrically active zones through contacts 500.

The integrated circuit also comprises a certain number of dummy zones ZF1-ZF5 as well as other metallic tracks PST at the metal level M1. Some of these dummy zones, referenced ZF5, which are not located under metallic tracks PST, are provided with four additional contacts 510.

Other dummy zones, which are overhung at least partially by a metallic track PST, comprise a smaller number of additional contacts. Such is the case, for example, for the dummy zones ZF2 which comprise only two additional contacts 510. Such is also the case for the dummy zone ZF1 which comprises three of them.

The dummy zone ZF3 does not comprise any additional contact since they would come into contact with a metallic track PST. The dummy zones ZF4, which are overhung at the border by a metallic track PST also comprise only two additional contacts 510 disposed so as not to come into contact with a metallic track PST.

Figure 8:
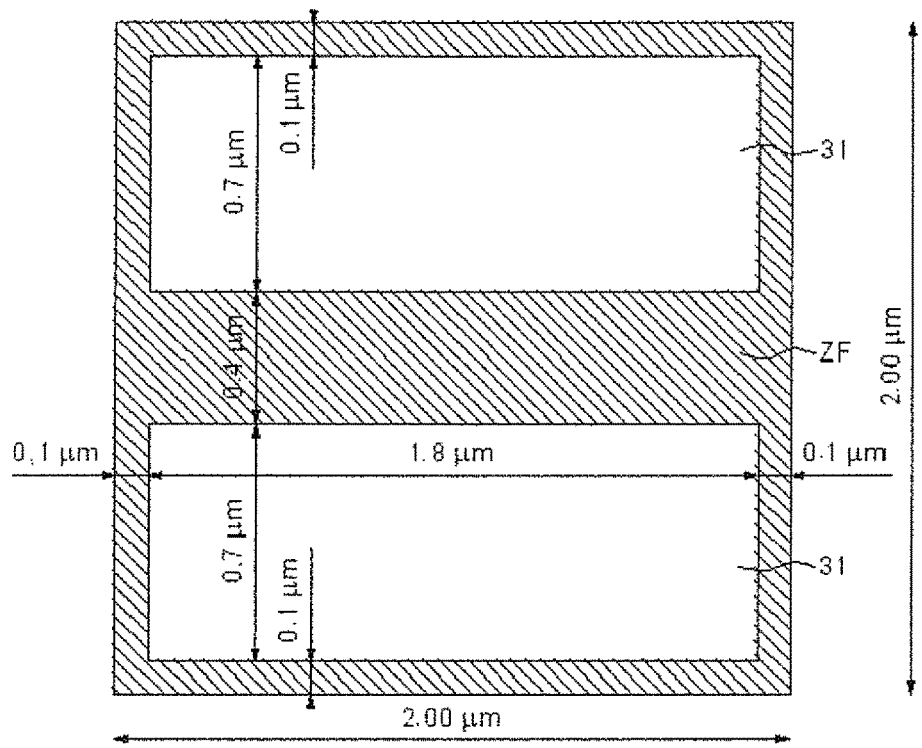
FIG. 8 is a top plan view of additional opening zones of the mask having a rectangular shape in accordance with the present invention.

The shape of the opening zones 31 and consequently of the additional contacts may be arbitrary. Thus, as illustrated in FIG. 8, and still in a 130-nm technology, the additional opening zones 31 intended to form the additional contacts may be, for example, rectangles 1.8 microns long and 0.7 microns wide positioned above a square dummy zone ZF of 2 microns sides.

Figure 9:
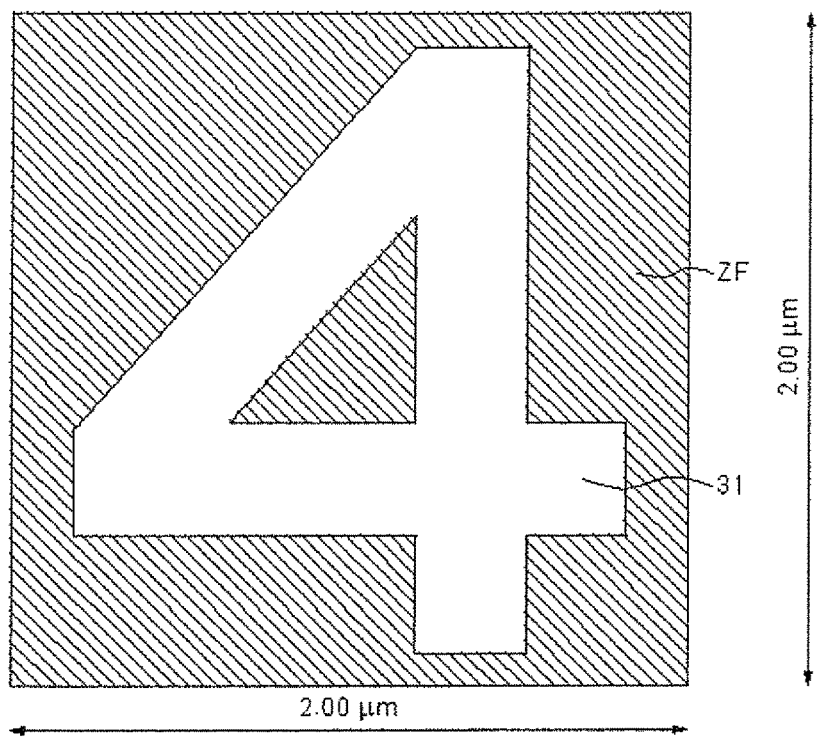
FIG. 9 is a top plan view of an additional opening zone of the mask having the shape of the number 4.

In FIG. 9, the additional opening zone 31 has the shape of the digit 4 and can also be positioned above a square dummy zone ZF of 2 microns sides.

The invention claimed is:

1. A method for making a photolithography mask used for formation of electrically conducting contact pads between metallic tracks of a metallization level and electrically active zones of integrated circuits formed on a semiconductor wafer, the semiconductor wafer including the electrically active zones and dummy zones that are separated from the electrically active zones by isolation regions, the method comprising:

forming a first photolithography mask region corresponding to the electrically active zones, the first photolithography mask region including first openings for the formation of the contact pads, the first openings having a first degree of opening defined by a first ratio between a surface area of the first openings and a useful total surface area of the photolithography mask, the first degree of opening being less than 3.5%; and increasing an overall degree of opening of the photolithography mask to reduce defects in the formation of the contact pads in the electrically active zones by forming a second photolithography mask region corresponding to the dummy zones, the second photolithography mask region including additional openings for the formation of dummy contact pads, the first openings and the additional openings together having the overall degree of opening of the photolithography mask defined by a second ratio between a surface area of all of the first and additional openings and the useful total surface area of the photolithography mask, the overall degree of opening being equal to or greater than 3.5%, wherein each of the additional openings has a surface area that is greater than a surface area of each of the first openings.

2. The method according to claim 1, wherein the overall degree of opening is greater than or equal to 5%.

3. The method according to claim 1, wherein the additional openings are positioned to correspond to sites located away from the metallic tracks of the metallization level.

4. The method according to claim 1, wherein each first opening is a square having sides of a first dimension, r, and each additional opening is a square having sides of a second dimension that is equal to or greater than 2r.

5. The method according to claim 4, wherein each additional opening has a surface area that is less than or equal to $25r^2$.

6. The method according to claim 4 wherein the first dimension, r, is 0.2 microns.

7. The method according to claim 6 wherein the second dimension is 0.7 microns.

8. The method according to claim 7 wherein neighboring ones of the additional openings are spaced apart from one another by at least 0.4 microns.

9. The method according to claim 4 wherein at least one of the additional openings has a rectangular shape including a first side of a first dimension, and a second side of a second dimension that is different from the first dimension.

10. The method according to claim 4 wherein at least one of the additional openings has a shape of an alphanumeric character.

11. A method for producing electrically conducting contact pads between metallic tracks of a metallization level and electrically active zones of integrated circuits formed on a semiconductor wafer, the semiconductor wafer including the electrically active zones and dummy zones that are separated from the electrically active zones by isolation regions, the method comprising:

forming an electrically insulating layer on the integrated circuits;

forming a photosensitive layer on the electrically insulating layer;

positioning a photolithography mask over the photosensitive layer, the photolithography mask including:

a first photolithography mask region corresponding to the electrically active zones, the first photolithography mask region including first openings for the formation of the contact pads, the first openings having a first degree of opening defined by a first ratio between a surface area of the first openings and a useful total surface area of the photolithography mask, the first degree of opening being less than 3.5%, and a second photolithography mask region that increases an overall degree of opening of the photolithography mask to reduce defects in the formation of the contact pads in the electrically active zones, the second photolithography mask region corresponding to the dummy zones and including additional openings for the formation of dummy contact pads, the first openings and the additional openings together having an overall degree of opening of the photolithography mask defined by a second ratio between a surface area of all of the first and additional openings and the useful total surface area of the photolithography mask, the overall degree of opening being equal to or greater than 3.5%, wherein each of the additional openings has a surface area that is greater than a surface area of each of the first openings;

irradiating the photosensitive layer through the photolithography mask to form vias therethrough;

etching at least one part of the insulating layer through the vias; and filling the etched vias with an electrically conducting material.

12. The method according to claim 11, wherein during the etching of the insulating layer at least one of the vias corresponding to at least one of the additional openings of the photolithography mask is not fully etched therethrough.

13. The method according to claim 11 wherein each first opening is a square having sides of a first dimension, r, and each additional opening is a square having sides of a second dimension that is equal to or greater than 2r.

14. The method according to claim 13 wherein each additional opening has a surface area that is less than or equal to $25r^2$.

15. The method according to claim 11 wherein the overall degree of opening is greater than or equal to 5%.

16. The method according to claim 11 wherein filling the etched vias with an electrically conducting material includes filling the etched vias with tungsten.

17. A method for making a photolithography mask used for formation of electrically conducting contact pads in a semiconductor wafer, the method comprising:

forming a first photolithography mask region corresponding to electrically active zones of the semiconductor wafer, the first photolithography mask region including first openings for the formation of the contact pads, the first openings having a first degree of opening being defined by a first ratio between a surface area of the first openings and a useful total surface area of the photolithography mask, the first degree of opening being less than 3.5%; and increasing an overall degree of opening of the photolithography mask to reduce defects in the formation of the contact pads in the electrically active zones by forming a second photolithography mask region corresponding to dummy zones of the semiconductor wafer, the second photolithography mask region including additional openings for the formation of dummy contact pads, the first openings and the additional openings together having the overall degree of opening of the photolithography mask defined by a second ratio between a surface area of all of the first and additional openings and the useful total surface area of the photolithography mask, the overall degree of opening being equal to or greater than 5%, wherein each of the first openings is a square having sides of a first dimension, r, and each additional opening is a square having sides of a second dimension that is equal to or greater than 2r.

18. The method according to claim 17, wherein the additional openings are positioned to correspond to sites located away from metallic tracks of a metallization level that extends over the electrically active zones and the dummy zones.

19. The method according to claim 17 wherein each additional opening has a surface area that is less than or equal to $25r^2$.

20. The method according to claim 17 wherein the first dimension, r, is 0.2 microns.

* * * * *